United States Patent [19]

Paice

[11] 4,209,739
[45] Jun. 24, 1980

[54] PORTABLE CALIBRATOR FOR D.C. CIRCUIT BREAKERS

[75] Inventor: Derek A. Paice, Pittsburgh, Pa.

[73] Assignee: The United States of America as represented by the Secretary of the Interior, Washington, D.C.

[21] Appl. No.: 919,645

[22] Filed: Jun. 27, 1978

[51] Int. Cl.² .......................................... G01R 31/02
[52] U.S. Cl. .................................... 324/424; 324/415
[58] Field of Search ........... 324/28 R, 28 CB, 28 CR, 324/73 R, 158 F

[56] References Cited

U.S. PATENT DOCUMENTS

| | | | |
|---|---|---|---|
| 3,259,839 | 7/1966 | Coleman et al. | 324/28 CB |
| 3,532,967 | 10/1970 | Milton et al. | 324/28 CB |
| 3,678,372 | 7/1972 | Elder | 324/28 R |
| 4,128,804 | 12/1978 | Russell | 324/28 CB |

*Primary Examiner*—Michael J. Tokar
*Attorney, Agent, or Firm*—Thomas Zack; Donald A. Gardiner

[57] ABSTRACT

A portable calibrator for d.c. circuit breakers is provided which produces a low voltage, short duration current test pulse of a current level sufficient to trip the breaker under test. The current pulse is produced by a high power, high frequency d.c. to d.c. converter which is controlled by lower power signals. A static switch controlled by the converter output provides current protection for the converter. A feedback loop including a current transformer connected in an output transformer circuit provides control of the test pulse. A non-inductive shunt connected in a negative test lead monitors the test pulse during the period of application thereof, the shunt being connected to a sample and hold read-out circuit which includes metering for indicating the peak current value. A timer interlocked with the metering ensures that sufficient time is provided for the operator to read current value.

18 Claims, 3 Drawing Figures

PORTABLE CALIBRATOR FOR D.C. CIRCUIT BREAKERS

FIELD OF THE INVENTION

The present invention relates to a portable calibrator for d.c. circuit breakers which is particularly adapted for use in coal mines and the like.

BACKGROUND OF THE INVENTION

Direct current power systems for coal mines are generally fed from several d.c. power substations at suitable spaced intervals (typically one mile) throughout the coal mine. The output power from the substations is fed through d.c. circuit breakers which will trip, and thus disconnect the d.c. power supply, when excessive current is being drawn.

Such d.c. circuit breakers must be calibrated such that the trip level or setting is high enough to permit normal load currents but sensitive enough to provide tripping of the breaker for low resistance, high current faults. Moreover, periodic calibration of the overcurrent trip setting of such breakers is necessary to ensure continued protection and safety for the mine system. In addition, on site adjustment and recalibration often becomes necessary as the mine workings advance and the requirement of the power system change.

The calibration techniques which are presently used for on site calibration of d.c. circuit breakers suffer a number of important disadvantages. In general, these techniques are cumbersome and because of the large amount of power required, potentially dangerous. For example, one known method uses large power resistor which have ratings of about 300 volts and 3600 amperes and which must be hauled to the circuit breaker location to perform the necessary testing. Another approach relies on the use of two locomotives to draw a large current from the breaker, thereby causing the breaker to trip. It is evident that neither of these appraoaches provides a convenient and accurate calibration test for circuit breakers.

More generally, other techniques have been used for in service testing of electromagnetic devices such as solenoids, relays and the like. An example of such a technique is disclosed in U.S. Pat. No. 3,976,933 (Banfi). This patent relates to a testing wherein a current is caused to pass through a normally de-energized coil to effect energization thereof or, conversely, for a normally energized coil, to effect de-energization thereof. A power source is provided which is separate from the power source being controlled by the device under test and, considering the example of a normally de-energized coil, currrent is passed for a short period of time so that various portions of the test system can be checked without activating the whole system. The Banfi system is a low power system and a simple low power transistor device is used to control the test current. Other patents of possible interest include U.S. Pat. Nos. 2,614,150 (Bucker); 3,604,976 (Zajic); 3,424,958 (Groat) and 3,852,660 (Maier), although this listing is obviously not represented to be exhaustive.

SUMMARY OF THE INVENTION

In accordance with the invention, a calibrator for d.c. breakers is provided which overcomes the problems associated with prior art techniques and which, while not limited to such applications, affords particular advantages with respect to on site calibration of d.c. circuit breakers utilized in coal mines. The calibrator of the present invention provides a low voltage, short duration, controlled amplitude current pulse which is passed through the series trip coil of the circuit breaker under test. The current level of the pulse produced by the calibrator is sufficient to provide tripping of the breaker whereas the voltage of the pulse is at a minimum level sufficient to overcome the resistance of the circuit breaker contacts and the test leads. The duration of the test pulse is very short (about 120 milliseconds in a specific example), this voltage and pulse duration being sufficient to provide results which are the same as would be the case if a steady d.c. current of the same value was employed. The use of a low voltage, short duration pulse results in a very substantial reduction in the power requirements which are only about one one-thousandths of that required by techniques presently used in coal mines. The calibrator of the invention is portable, easy to read, and very simple and safe to use. Further, the calibrator permits rapid, yet accurate, on-site calibration of d.c. circuit breakers.

An extremely important feature of the invention involves the use of a high power, high frequency solid state d.c. to d.c. converter and associated control circuitry for producing the test pulse described above. According to a preferred embodiment, a static switch is provided which is operated responsive to the converter output and which controls the power input from a d.c. power source to the converter so as to provide current protection when the calibrator is connected to the source. The converter comprises a thyristor inverter, with automatic commutation, controlled by low power signals which, when removed, cause termination of the inverter operation. The a.c. output of the converter is preferably rectified in cooperation with a series-tuned output transformer which minimizes the effects of leakage reactance.

Control of the test current pulse is provided by a closed feedback loop which preferably includes a current transformer which senses the primary current of the output transformer mentioned above and provides for control of the converter output in accordance therewith. The inverter has voltage-frequency characteristics whereby a drop in the output current below a predetermined level required for triggering of the test circuit breaker automatically results in a frequency increase and a corresponding increase in the output voltage of the inverter. A similar automatic decrease in the output frequency, and hence in output voltage, is provided where the current is too high.

An accurate, non-inductive shunt connected in one of the calibrator test leads monitors the test pulse during the period of application thereof, the voltage across the shunt being fed to a sample and hold circuit which maintains the peak current value. This value is indicated by a suitable metering arrangement which is interlocked with a timer to ensure that a minimum interval between operations is maintained to thereby provide the operator with sufficient time to read the actual current value. A low power variable resistor or the like connected in the feedback loop enables ready adjustment of the current pulse.

Other features and advantages of the invention will be set forth in, or apparent from, a detailed description of a preferred embodiment found hereinbelow.

DESCRIPTION OF A PREFERRED EMBODIMENT

Figure 1A:
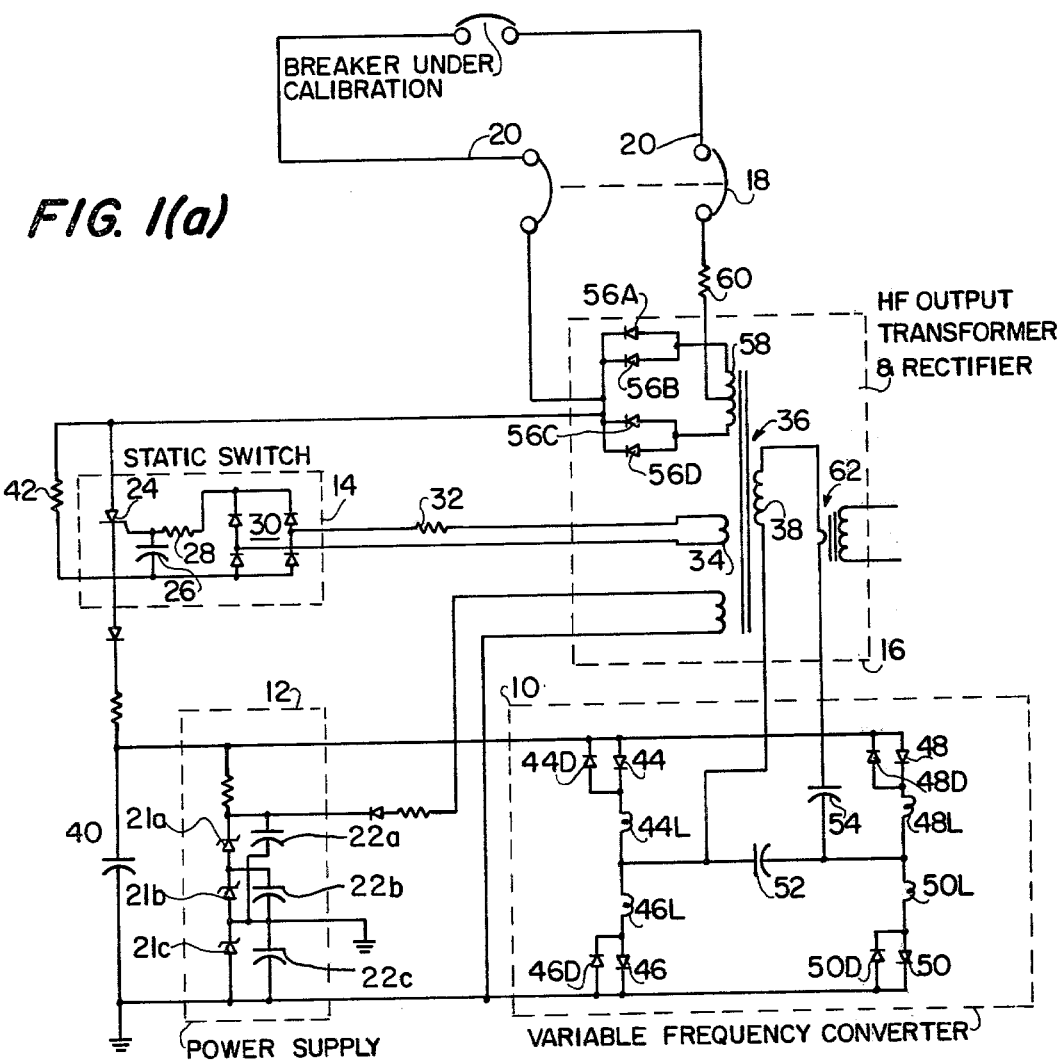
FIGS. 1(a) and (b) together a schematic circuit diagram of a preferred embodiment of the d.c. circuit breaker of the invention.
Figure 1B:
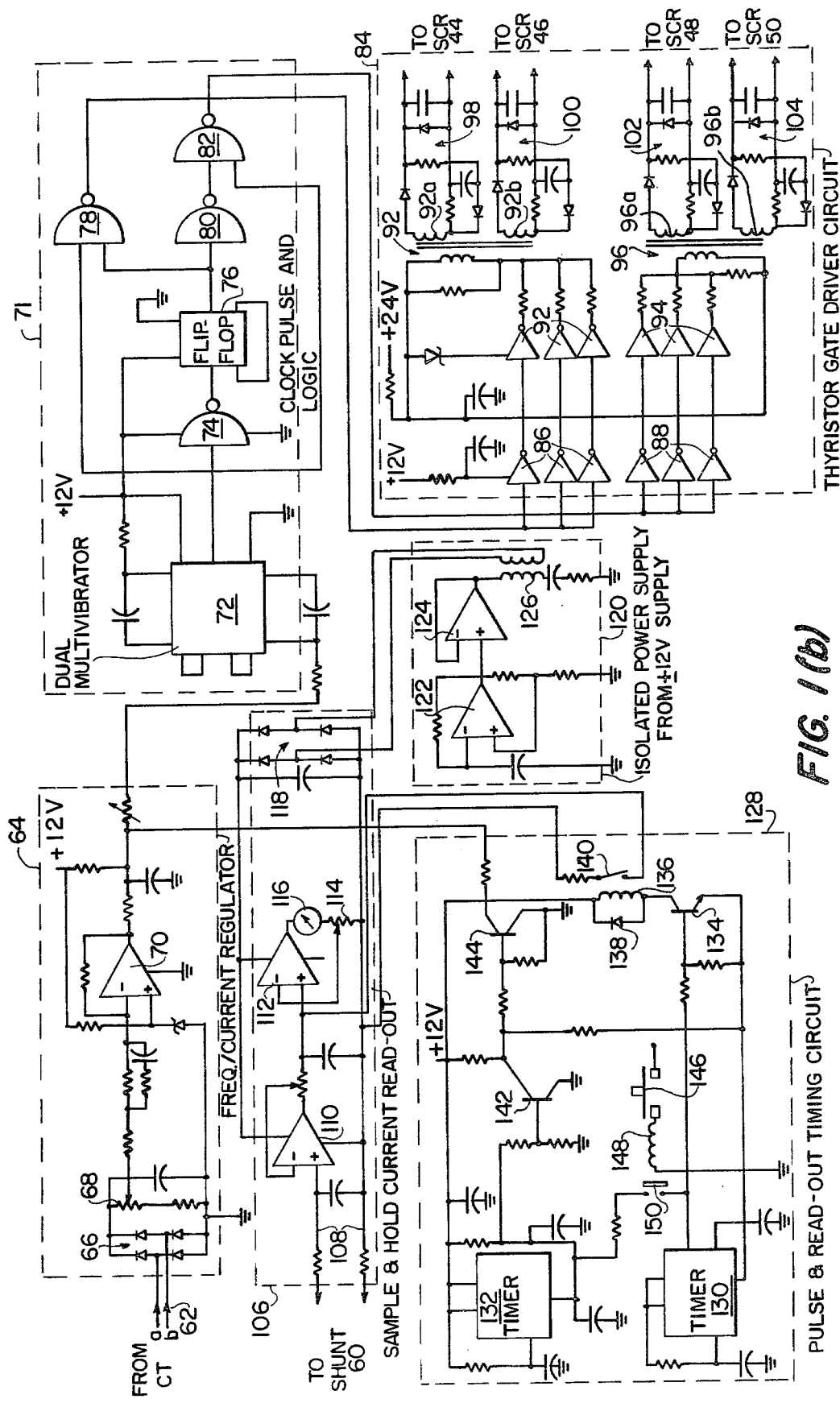

Referring to the drawings and, in particular to FIGS. 1(a) and 1(b), these figures constitute a schematic circuit diagram of the calibrator of the invention. Considering FIG. 1(a) first, generally speaking, FIG. 1(a) illustrates the power circuitry for the calibrator, this power circuitry basically comprising a variable frequency converter 10, a power supply 12, a static switch 14, and a high frequency output transformer and rectifier 16. The output of transformer-rectifier 16 is connected through a suitable model case circuit breaker 18 to a pair of test leads 20 which are connected to the circuit breaker under test.

Turning now to the individual circuits, power supply 12 basically comprises three zener diodes 21a, 21b and 21c and three capacitors 22a, 22b, and 22c, which are connected as shown to provide +24v, +12v and −12v outputs, in the exemplary embodiment under consideration. Power supply 12 receives its power from a substation feeding the breaker under test. The three outputs are substantially constant voltage values (+24V, +12V and −12V) which are used to operate the circuits as shown in FIG. 1(b).

Static switch 14 controls the input power to high frequency converter 10 and comprises an SCR or thyristor 24 whose gate electrode is connected through a shunt capacitor 26 and a series resistor 28 to a diode bridge 30. The output of bridge 30 is connected through a resistor 32 to one winding 34 of the transformer 36 of transformer and rectifier circuit 16. The input winding 38 of transformer 36 is connected to the output of converter 10 and hence thyristor 24 (and thus static switch 14) is controlled by the converter output. Switch 14 is "closed" only when converter 10 is called upon to supply an output pulse.

A filter capacitor 40, which protects the converter 10 from d.c. line voltage transients and provides stored energy, is charged through a resistor 42 when the test leads 20 are connected to the test circuit breaker, resistor 42 being connected in shunt across thyristor 24. Converter 10 is operational only when capacitor 40 is charged to some appropriate value, e.g., 220v in a nominal 300v. d.c. system. This arrangement including static switch 10 prevents inrush currents which would otherwise occur when the test equipment is connected to the d.c. power source.

Variable frequency power converter 10 comprises a thyristor inverter including four thyristors 44, 46, 48 and 50 having associated diodes 44D, 46D, 48D and 50D connected thereacross and inductors 44L, 46L, 48L and 50L connected in series therewith. These inductors, together with a capacitor 52 connected between the junction between inductors 44L and 46L and the junction between inductors 48L and 50L, provide automatic commutation. The a.c. output of converter 10 is rectified in conjunction with transformer 36 which is series tuned by a capacitor 54 to minimize the effects of leakage reactance. Capacitor 54 also aids in controlling the output current.

Transformer-rectifier circuit 16 also includes a rectifier formed two pairs of diodes 56A to 56D connected to transformer output winding 58. A shunt resistor 60 which is connected in series with the negative lead of the leads 20 provides a reference voltage as discussed below. Further, a current transformer 62 connected in the converter output circuit provides a current feedback signal as is also discussed hereinbelow. Because of the inductance of the output connecting leads 20 and the fact that a relatively high frequency (3kHz in the embodiment under consideration) is used, the rectified output current pulse is nearly pure d.c.. As noted above, the output leads 10 can be readily isolated from the circuit breaker under test by means of the molded case circuit breaker 18.

Referring to FIG. 1(b), the output terminals "a" and "b" of current transformer 62 form the input to a frequency/current regulator 64 whose function is discussed in more detail below. Regulator 64 includes an input diode rectifier bridge 66 and a potentiometer 68 which is used to set the pulse level. The output tap of potentiometer 68 is connected to an operational amplifier 70 including associated circuitry connected as shown.

The output of frequency/current regulator 64 is connected to a clock pulse and logic circuit 71. Circuit 71 includes a dual multivibrator 72 which receives a control input from amplifier 71 and the output of which is connected to three NAND gates 74, 78 and 82. The output of NAND gate 74 controls the switching state of a flip-flop 76 whose output forms a second input to NAND gate 78 and the input to a further NAND gate 80. The output of NAND gate 80 forms the second input to NAND gate 82.

The output pulses produced by NAND gates 78 and 82 serve as the control pulses for a thyristor gate driver circuit 84. Thyristor driver 82 includes a first set of inverter-buffers 86 connected to the output of NAND gate 78 and a second set on inverter-buffers 88 connected to the output of NAND gate 82. The outputs of inverter-buffers 86 are individually connected to a further set of inverter-buffers 90 whose commoned outputs are connected to the primary winding of a first transformer 92. Similarly, the outputs of inverter-buffers 88 are individually connected to inverter-buffers 94 whose commoned outputs are connected to the primary winding of a second transformer 96.

The secondary output of windings 92a and 92b of transformer 92 are connected in individual pulse shaping circuits 98 and 100 which are illustrated in FIG. 1(b) and which produce undirectional output pulses for triggering SCR 44 and SCR 50, respectively. Similarly, the secondary windings 96a and 96b of transformer 96 are connected in similar pulse shaping circuits 102 and 104 which produce unidirectional triggering pulses for SCR 48 and SCR 46, as indicated.

A sample and hold current read-out circuit 106 is adapted to be connected across shunt resistor 60 which was mentioned above and which is connected in one lead of the test leads, viz., the negative lead, as shown in FIG. 1(a). Circuit 106 basically comprises a pair of input connections 108 which are to be connected across resistor 60 and first and second operational amplifiers 110 and 112 which are connected as shown and form a sample and hold amplifier which retains the peak current value of the shunt voltage. A variable calibration resistor 114 and an ammeter 116 are connected to second operational amplifier 112. Ammeter 116 provides a current readout for reading by an operator while resistor 114 provides calibration of the meter between 0–5000 A.

Power for sample and hold current read-out circuit 106 is supplied through a bridge network 118 from an isolated power supply 120. Power supply 120 includes a pair of operational amplifiers 122 and 124 and an isolated output transformer 126, all connected as illustrated.

Operation of sample and hold circuit read-out circuit 106 is controlled by a pulse and read-out timing circuit 128. Timing circuit 128 includes read-out timer 130 which produces control pulses that are coupled to the base of a control transistor 134. The emitter-collector circuit of transistor 134 is connected in series with a reset relay coil 136 shunted by a diode 138. Relay 136 controls opening and closing of relay contacts 140 which are connected across the input to read-out operational amplifier 112 and hence control activation of the latter. Generally speaking, the purpose of read-out timer 130 is to provide that there is a minimum time interval between operations to ensure that the operator has sufficient time to read meter 116. This minimum time is typically 10 seconds in an exemplary embodiment.

Pulse timer 132 is connected through a pair of transistor switching stages 142 and 144 which comprise an oscillator start control circuit whose output is connected to the input of multivibrator 72 of clock pulse and logic circuit 71. A manual push-to-operate switch 146, connected in series with a relay coil 148, controls actuation of relay contacts 150 connected to an input pulse timer 132 so as to thereby control activation of the latter. Timer 132 control the output current pulse duration which is typically 120 milliseconds in the exemplary embodiment under consideration. It is noted that the controls provided by timers 130 and 132 enable the average power rating of the equipment to be much less than the pulse power rating which is typically about 46kW.

Considering the operation of the calibrator unit of FIGS. 1(a) and 1(b), with switch 146 closed, timer 132 will activate clock pulse and logic circuit 71 so as to supply control pulses to thyristor gate driver circuit 84. For continuous operation, low power gate signals must be continuously applied to converter 10. When these low power signals are removed, operation of converter 10 terminates. Thus, the high power, high frequency a.c. output of converter 10 is controlled by low power signals from the circuits of FIG. 1(b). Moreover, as discussed above, the time duration of the output pulse or pulses produced by converter 10 is controlled by a completely static switching arrangement.

Figure 2:
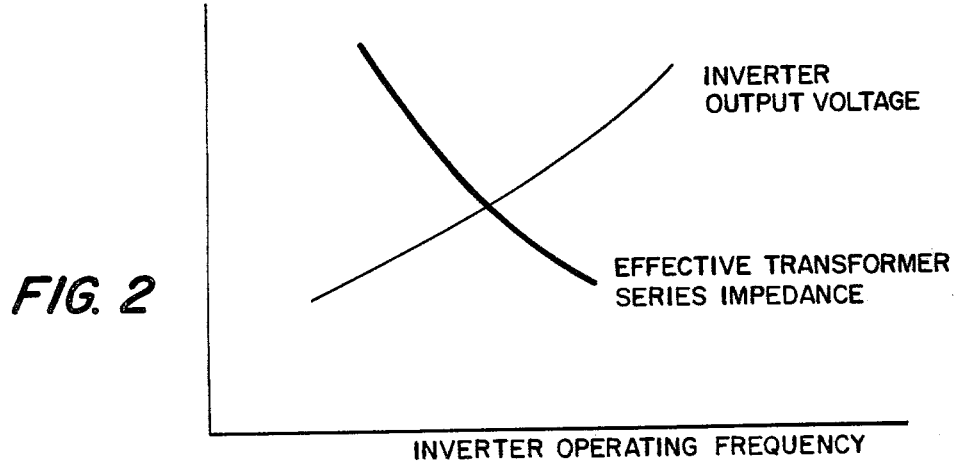
FIG. 2 is a diagram which plots inverter output voltage and transformer impedance as a function of inverter operating frequency.

In order to ensure that the output current pulse provided by converter 10 is of the predetermined value required, the primary current of transformer 36 is measured by current transformer 62 and controlled by a closed loop feedback system including frequency/current regulator circuit 64. The latter receives the output of current transformer 62 and is connected to the input of clock pulse and logic circuit 71 so as to control the operation thereof. As is evident from FIG. 1(b) this closed loop feedback system, which includes circuits 64, 71 and 84, operates by varying the operating frequency of converter 10 to provide the necessary control of the output current pulse. By virtue of this arrangement the d.c. output test pulse is held constant, within ±5%, despite large variations in the d.c. input voltage or variations in the resistance of the connecting leads 20. Further, when the output current is lower than a predetermined level the switching frequency of converter 10 automatically increases. Thus has the effect of raising the output voltage of the thyristor inverter which forms converter 10 as is indicated in FIG. 2 which shows the inverter characteristics. Further, the reactance of series capacitor 54 is reduced so as to reduce the effective series impedance of output transformer 36. Conversely, the output frequency is automatically reduced if the current is too high.

As noted above, in operation, timers 132 and 130 are respectively set to control the output pulse duration (typically 120 milliseconds) and the minimum time interval between operations (typically 10 seconds). During the time interval of the application of the output current pulse, the pulse is monitored by shunt 60 connected in the negative test lead 20. Shunt 60 is non-inductive (resistive) and provides an accurate reference voltage which is fed to sample and hold current read-out circuit 106. As discussed above, sample and hold amplifier 110 retains the peak current value and feeds the same to read-out amplifier 112 and associated meter 116. The interlock between meter 116 and read-out timer 130 guarantees that the minimum 10 second delay referred to above is available for reading the meter.

Although the invention has been described relative to exemplary embodiments thereof, it will be understood that other variations and modifications can be effected in these embodiments without departing from the scope and spirit of the invention.

I claim:

1. A portable calibrator for a d.c. circuit breaker having a trip coil, said calibrator comprising:
   connecting leads for connecting the calibrator to the trip coil of the d.c. circuit breaker under test, test pulse generating means connected to said connecting leads for applying a constant amplitude current pulse that lasts for less than several hundred milliseconds to the d.c. circuit breaker under test of a current value sufficient to cause tripping of that circuit breaker and at a voltage level sufficient to overcome the resistance of the circuit breaker contacts and the connecting leads; and
   means for measuring the current pulse applied to the circuit breaker and providing and indication of the value thereof for comparison purposes with the required trip value of current for the breaker.

2. A calibrator as claimed in claim 1 wherein said test pulse generating means comprises a d.c. to d.c. converter.

3. A calibrator as claimed in claim 2 wherein said converter comprises a high frequency automatically commutating thyristor inverter which is controlled by low power gate signals and the voltage output of which increases with increasing operating frequency.

4. A calibrator as claimed in claim 2 further comprising static switch means operable responsive to the output of said converter for controlling the power input to said converter from a d.c. source.

5. A calibrator as claimed in claim 4 wherein said static switch comprises a thyristor switch connected to and controlled by a transformer connected in the output of said converter.

6. A calibrator as claimed in claim 5 further comprising a capacitor connected in series with said thyristor switch across the d.c. source and a resistor connected across said thyristor switch.

7. A calibrator as claimed in claim 1 further comprising feedback means for sensing the output of said pulse generating means and for controlling the current pulse produced thereby in accordance with the sensed output.

8. A calibrator as claimed in claim 2 further comprising an output transformer connected to the output of said converter and rectifier means for rectifying the output voltage of said transformer, said calibrator further including a capacitor for series tuning said transformer so as to minimize the effects of leakage reactance.

9. A calibrator as claimed in claim 7 further comprising a capacitor connected in series with said thyristor switch across the d.c. source and a resistor connected across said thyristor switch.

10. A calibrator as claimed in claim 9 wherein said feedback means includes a current transformer in series with said output transformer for producing a current feedback signal.

11. A calibrator as claimed in claim 7 wherein said feedback means includes a variable resistance means for setting the level of the converter output pulse.

12. A calibrator as claimed in claim 10 wherein said feedback means includes rectifier means for rectifying the output of said current transformer and a variable resistance means for setting the level of the converter output pulse.

13. A calibrator as claimed in claim 2 wherein said measuring means comprises a sample and hold current read-out circuit.

14. A calibrator as claimed in claim 1 wherein said measuring means includes a non-inductive shunt connected in one of said connecting leads, peak current measuring means for indicating the peak current through said shunt and calibration means for said peak current measuring means.

15. A calibrator as calimed in claim 14 further comprising timing means interlocked with said peak current measuring means for providing a predetermined time period for reading of the peak current indication provided by said peak current measuring means.

16. A calibrator as claimed in claim 1 wherein said test pulse generating means includes multivibrator means and clock pulse and logic circuitry, said calibrator further comprising pulse control timing means for controlling said multivibrator.

17. A calibrator as claimed in claim 16 wherein said converter means comprises a gate-pulse controlled thyristor inverter, said calibrator further comprising thyristor gate driver connected to the output of said clock pulse and logic circuitry and to the input of said thyristor inverter.

18. A calibrator as claimed in claim 17 further comprising feedback means connected between the output of said converter means and the input to said multivibrator means for sensing the output of said converter means and controlling said multivibrator means in accordance therewith.

* * * * *